United States Patent
Bolotnikov et al.

(10) Patent No.: US 9,716,144 B2
(45) Date of Patent: Jul. 25, 2017

(54) SEMICONDUCTOR DEVICES HAVING CHANNEL REGIONS WITH NON-UNIFORM EDGE

(71) Applicant: GENERAL ELECTRIC COMPANY, Schenectady, NY (US)

(72) Inventors: Alexander Viktorovich Bolotnikov, Niskayuna, NY (US); Peter Almern Losee, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 10 days.

(21) Appl. No.: 14/577,451

(22) Filed: Dec. 19, 2014

(65) Prior Publication Data
US 2016/0181365 A1    Jun. 23, 2016

(51) Int. Cl.
| | | |
|---|---|---|
| H01L 29/10 | (2006.01) | |
| H01L 21/31 | (2006.01) | |
| H01L 29/06 | (2006.01) | |
| H01L 29/66 | (2006.01) | |
| H01L 29/73 | (2006.01) | |
| H01L 21/26 | (2006.01) | |
| H01L 29/08 | (2006.01) | |
| H01L 29/78 | (2006.01) | |
| H01L 29/739 | (2006.01) | |

(52) U.S. Cl.
CPC ...... *H01L 29/1037* (2013.01); *H01L 29/0607* (2013.01); *H01L 29/0692* (2013.01); *H01L 29/0865* (2013.01); *H01L 29/1095* (2013.01); *H01L 29/66333* (2013.01); *H01L 29/66712* (2013.01); *H01L 29/7395* (2013.01); *H01L 29/7802* (2013.01)

(58) Field of Classification Search
CPC ........... H01L 29/1037; H01L 21/31111; H01L 29/0692; H01L 29/66712; H01L 29/7395; H01L 21/26513; H01L 29/0865; H01L 29/66333; H01L 29/7802; H01L 29/1095; H01L 29/0607
USPC ............................. 257/360; 438/309; 3/360
See application file for complete search history.

(56) References Cited

U.S. PATENT DOCUMENTS

| | | | |
|---|---|---|---|
| 5,101,250 A | 3/1992 | Arima et al. | |
| 5,231,041 A | 7/1993 | Arima et al. | |
| 5,998,837 A * | 12/1999 | Williams | ............ H01L 27/0255 257/328 |

(Continued)

OTHER PUBLICATIONS

Taur, Yuan, MOSFET Channel Length: Extraction and Interpretation, IEEE Transactions on Electron Devices, Jan. 2000, pp. 160-170, vol. 47, No. 1.

(Continued)

*Primary Examiner* — John C Ingham
*Assistant Examiner* — Didarul Mazumder
(74) *Attorney, Agent, or Firm* — Pabitra K. Chakrabarti (57) ABSTRACT

A semiconductor device may include a drift region having a first conductivity type, a source region having the first conductivity type, and a well region having a second conductivity type disposed adjacent to the drift region and adjacent to the source region. The well region may include a channel region that has the second conductivity type disposed adjacent to the source region and proximal to a surface of the semiconductor device cell. The channel region may include a non-uniform edge that includes at least one protrusion.

15 Claims, 12 Drawing Sheets

(56) References Cited

U.S. PATENT DOCUMENTS

| | | | |
|---|---|---|---|
| 6,114,205 A | 9/2000 | Mori | |
| 6,124,611 A | 9/2000 | Mori | |
| 6,204,533 B1 * | 3/2001 | Williams | H01L 27/0255 257/331 |
| 6,221,737 B1 | 4/2001 | Letavic et al. | |
| 6,239,463 B1 * | 5/2001 | Williams | H01L 29/165 257/328 |
| 6,414,370 B1 * | 7/2002 | Nagasu | H01L 29/0692 257/360 |
| 7,889,016 B2 | 2/2011 | Wang | |
| 8,269,275 B2 | 9/2012 | Chen et al. | |
| 8,642,415 B2 | 2/2014 | Adam et al. | |
| 8,659,081 B2 | 2/2014 | Chen et al. | |
| 8,674,435 B2 | 3/2014 | Kang et al. | |
| 9,006,027 B2 | 4/2015 | Stum et al. | |
| 9,024,328 B2 | 5/2015 | Bolotnikov et al. | |
| 2013/0017658 A1 | 1/2013 | Chen et al. | |
| 2013/0292766 A1 | 11/2013 | Adam et al. | |
| 2014/0042505 A1 | 2/2014 | Benjamin | |
| 2015/0008448 A1 | 1/2015 | Bolotnikov et al. | |
| 2015/0144960 A1 | 5/2015 | Saia et al. | |
| 2015/0155355 A1 | 6/2015 | Losee et al. | |

OTHER PUBLICATIONS

Mohapatra, Sushanta Kumar, Investigation of Dimension Effects of FD-S-SOI MOSFET in Nanoscale, 1st International Conference on Emerging Technology Trends in Electronics, Communication and Networking, 2012, pp. 1-4.

* cited by examiner

SEMICONDUCTOR DEVICES HAVING CHANNEL REGIONS WITH NON-UNIFORM EDGE

BACKGROUND

The subject matter disclosed herein relates to semiconductor devices, such as silicon carbide (SiC) power devices, including field transistors (e.g., metal-oxide-semiconductor field-effect-transistor (MOSFET), DMOSFET, UMOSFET, VMOSFET, etc.), insulated gate bipolar transistors (IGBT), insulated base MOS-controlled thyristors (IBMCT), junction field effect transistors (JFET), and metal-semiconductor field effect transistors (MESFET).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power semiconductor devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors).

Generally, when a power device or a semiconductor device is conducting current, the on-state resistance of the semiconductor device represents its conduction loss, which impacts the efficiency of the power conversion system and its cost. That is, the semiconductor includes a number of internal components that create resistance to the current flowing through the device. Accordingly, semiconductor devices that have improved on-state resistance are desirable.

BRIEF DESCRIPTION

In one embodiment, a semiconductor device may include a drift region having a first conductivity type, a source region having the first conductivity type, and a well region having a second conductivity type disposed within the drift region and adjacent to the source region. The well region includes a channel region that disposed adjacent to the source region and proximal to a surface of the semiconductor device cell. The channel region may have a non-uniform edge that includes at least one protrusion that results in variable channel length along its width.

In another embodiment, a semiconductor device may include a substrate layer and an epitaxial layer disposed on top of the substrate layer. The epitaxial layer may include a source region implanted into a surface of the epitaxial layer and having a first conductivity type and a well region implanted into the surface of the epitaxial layer adjacent the source region and having a second conductivity type. The well region may include a channel region with the non-uniform edge.

In yet another embodiment, a method of fabricating a semiconductor device may include disposing a mask having a non-uniform periphery over a semiconductor layer and implanting a well region into the semiconductor layer. The edge of the well region is imparted by the non-uniform periphery of the mask. The method may then include forming a conformal film layer over the mask and the surface of the semiconductor layer and etching away a first portion of the conformal film layer to form a spacer layer and expose a portion of the well region. The method may then include implanting a source region into the surface of the semiconductor layer adjacent to the well region, such that the source region is self-aligned to well region.

BRIEF DESCRIPTION OF THE DRAWINGS

These and other features, aspects, and advantages of the present embodiments will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

One of the essential building blocks of modern power electronics is the field-effect transistor (FET) device. Generally, a FET device, such as a metal-oxide semiconductor field-effect transistor (MOSFET) device, includes a source terminal, a gate terminal, and a drain terminal. According to MOSFET operation, a conductive pathway is created between the source and drain terminals when the gate-to-source voltage is greater than some threshold, allowing current to flow from the source terminal to the drain terminal. The channel region of a MOSFET device, as will be discussed in greater detail below, is an upper portion of the well region disposed under the gate electrode that, under sufficient gate-to-source voltage, forms a conductive path between the source region and the JFET region of the power MOSFET device.

As mentioned above, the internal components of the semiconductor device, such as the channel region, each provide resistances to the flow of current between device terminals. With this in mind, present embodiments are directed toward MOSFET devices that include a channel region having non-uniform edge and thus varying channel length. That is, one end of the channel region may include periodic protrusions, such that the length of the channel region is non-uniform along the width of the channel region. For example, as discussed below, in certain embodiments, the disclosed non-uniform edge channel region may include relatively longer portions, with relatively shorter portions interspersed between, to form a pattern (e.g., repetitive, periodic) along periphery of the well region. The presently disclosed channel regions of edge enable the fabrication of MOSFET devices having a shorter effective channel length while still providing a similar blocking voltage when compared to MOSFET devices having channel regions of uniform or constant length. Accordingly, this reduced effective channel length enables the presently disclosed MOSFET devices to have reduced resistance in the channel region, which translates to reduced conduction losses and potential improved efficiency of power conversion systems utilizing these devices.

Figure 1:
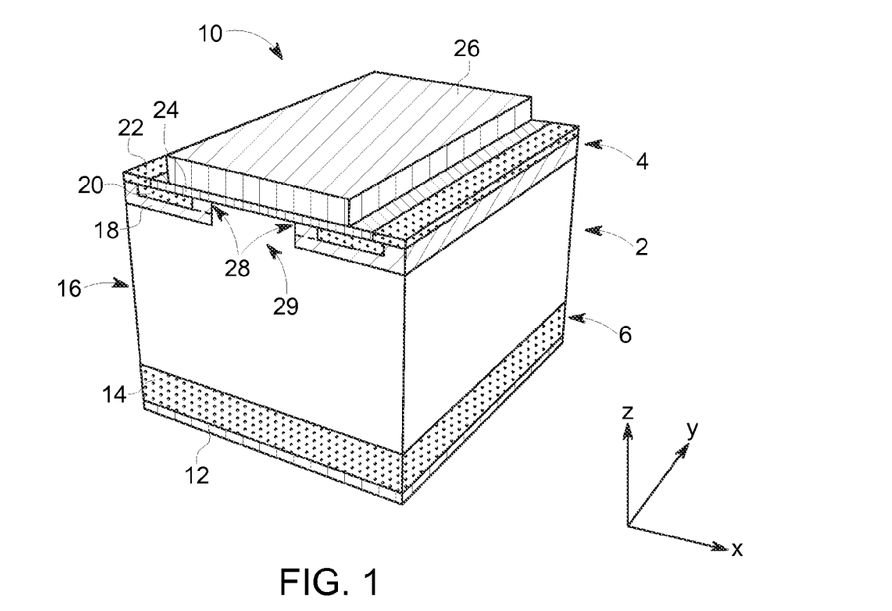
FIG. 1 illustrates a perspective view of a planar vertical MOSFET device, in accordance with an embodiment.

By way of introduction, FIG. 1 illustrates an active cell of a planar n-channel field-effect transistor, namely a DMOSFET, hereinafter MOSFET device 10. It may be appreciated that, in order to focus on certain specific components of the MOSFET device 10, as well as other devices discussed below, certain commonly understood design elements (e.g., top metallization, passivation, edge termination, and so forth) may be omitted. The illustrated MOSFET device 10 of FIG. 1 includes an epitaxial semiconductor layer 2 (e.g., an epitaxial silicon carbide (SiC) layer) having a first surface 4 and a second surface 6. The semiconductor layer 2 includes a drift region 16 having a first conductivity type (e.g., an n-type), a well region 18 within the drift region 16 and proximal to the first surface 4, the well region having a second conductivity type (e.g., a p-type 18). The semiconductor layer 2 also includes a source region 20 that is adjacent to the well region 18, the source region 20 having the first conductivity type (e.g., n-type). A gate-insulating layer 24 is disposed on a portion of the first surface 4 of the semiconductor layer 2, and a gate electrode 26 is disposed on the gate-insulating layer 24. The second surface 6 of the semiconductor layer 2 is a substrate layer 14, and the drain contact 12 is disposed on the bottom of device 10 along the substrate layer 14. A source/body contact 22 is disposed on top of the semiconductor layer 2, partially covering source region 20 and well regions 18. During operation, an appropriate gate voltage (e.g., above a threshold voltage ($V_{TH}$) of the MOSFET device 10) forms an inversion layer in the channel region 28, as well as a conductive path to be enhanced in the upper portion of junction field-effect transistor (JFET) region 29 due to accumulation of carriers, allowing current to flow between the contact 22 (i.e., the source electrode) and the drain contact 12. As mentioned above, for the MOSFET devices discussed herein, the channel region 28 may be generally defined as an upper portion of the p-well region 18 disposed below the gate electrode 26 and gate dielectric 24.

Figure 2:
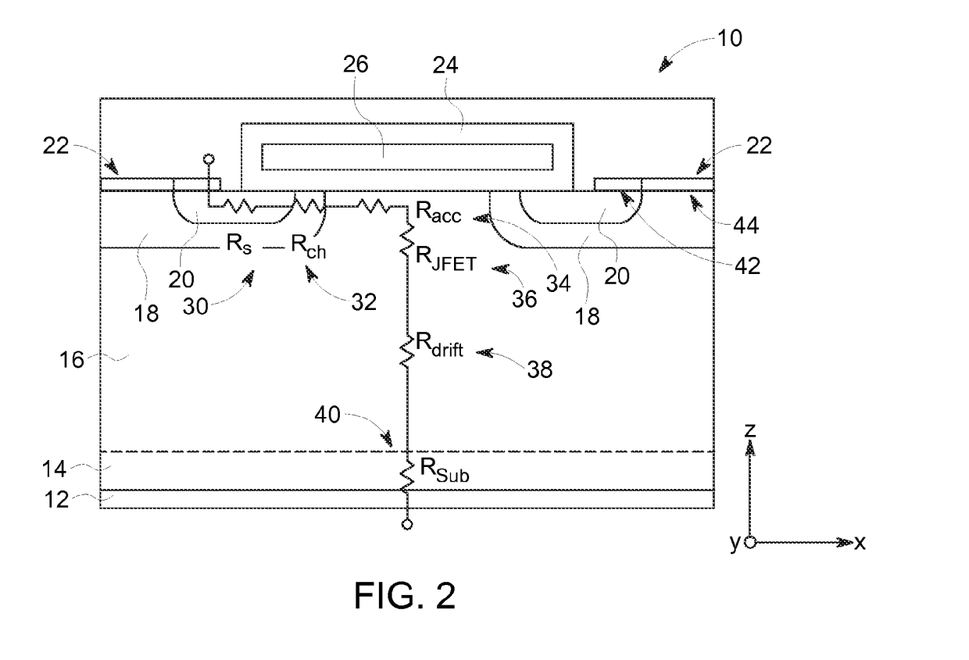
FIG. 2 illustrates a schematic diagram of resistances for various regions of the vertical MOSFET device of FIG. 1, in accordance with an embodiment.

As illustrated in FIG. 2, the various regions of the MOSFET device 10 may each have an associated resistance, and a total resistance (e.g., an on-state resistance, Rds(on)) of the MOSFET device 10, which may be represented as a sum of each of these resistances. For example, as illustrated in FIG. 2, on-state resistance, $R_{ds}$(on), of the n-channel MOSFET device 10 may be approximated as a sum of: a resistance $R_s$ 30 (e.g., a resistance of source region 20 and a resistance of the contact 22); a resistance $R_{ch}$ 32 (e.g., an inversion channel resistance of the region 28 illustrated in FIG. 1); a resistance $R_{acc}$ 34 (e.g., a resistance of an accumulation layer between the gate oxide 24 and portion of JFET region 29 located between p-well regions 18); a resistance $R_{JFET}$ 36 (e.g., resistance of un-depleted region between p-well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 2 are not intended to be exhaustive, and that other resistances (e.g., drain contact resistance, spreading resistance, etc.) could potentially be present within the semiconductor device 10. Although FIG. 2 depicts a linear cell design for the MOSFET device 10, it should be noted that the systems and techniques of the embodiments described herein are also applicable to other types of cell designs that are square, hexagonal, and the like.

With the foregoing in mind, present embodiments are directed toward device designs and layouts that enable improved semiconductor device performance. In particular, to reduce or minimize device on-state conduction losses it may be desirable to reduce resistance of the components of the MOSFET device 10. In certain cases, one or two resistance components may dominate conduction losses, and addressing these factors can significantly impact the $R_{ds}$(on) of the device. For example, for devices in which the drift resistance 38, the substrate resistance 40 and the source and contact resistance 30 are negligible (such as low-voltage devices) or for devices suffering from low inversion layer mobility (e.g. SiC devices), the channel resistance ($R_{ch}$ 32) may account for a significant portion of device conduction losses. Accordingly, present embodiments include device designs having channel regions 28 of varying length to reduce the channel resistance ($R_{ch}$ 32) and, thereby, reduce on-state conduction losses without compromising the blocking capability of the MOSFET device 10. While the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable semiconductor) as well as other types of device structures (e.g., insulated gate bipolar transistors (IGBT), insulated base MOS-controlled thyristors (IBMCT), junction field effect transistors (JFET), or any other suitable device) utilizing both n- and p-channel designs.

Figure 3:
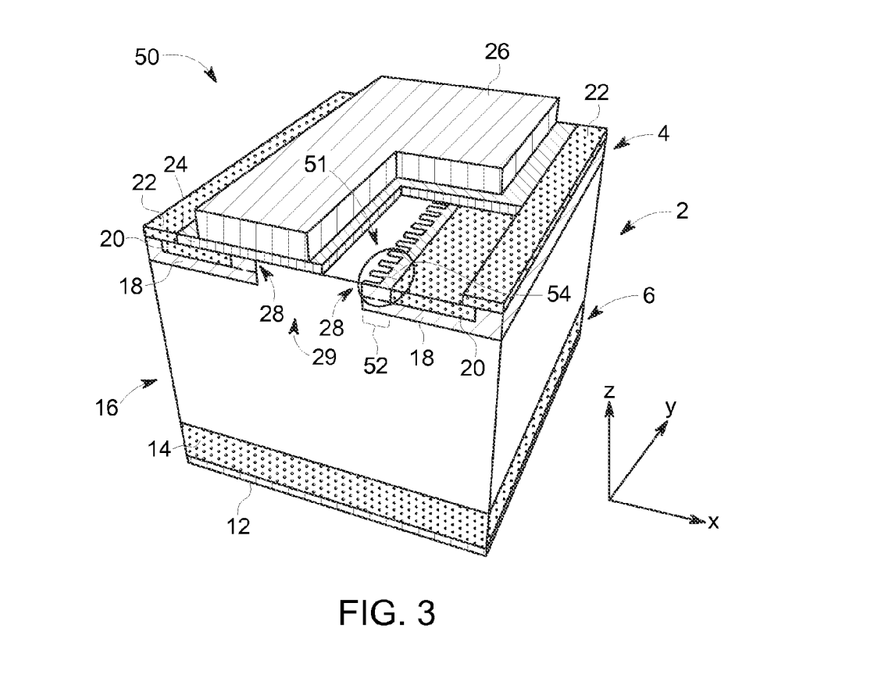
FIG. 3 illustrates a perspective view of a planar vertical MOSFET device having a channel region with non-uniform edge, in accordance with an embodiment.
Figure 4:
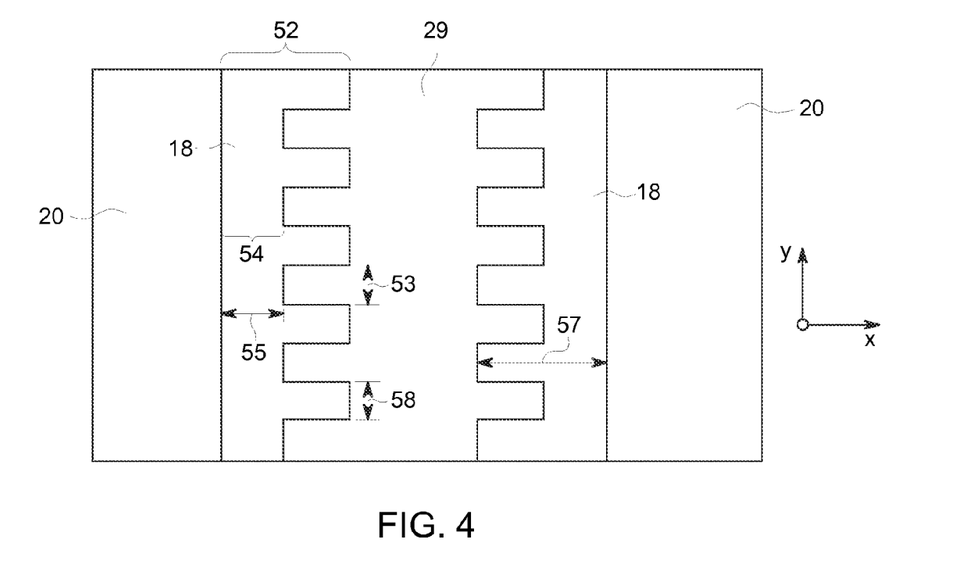
FIG. 4-11 illustrates top views of a planar vertical MOSFET device having various-shaped channel regions with non-uniform edge, in accordance with an embodiment.

With this in mind, FIG. 3 illustrates an embodiment of a MOSFET device 50 having a channel region 28 with a non-uniform or varying edge. As shown in FIG. 3, the interface between the well region 18 and the JFET region 29 that defines the channel region 28 includes a number of long regions 52 paired sequentially with a number of short regions 54. FIG. 4 depicts a top view of the MOSFET device 50 to further illustrate one embodiment of an arrangement of the long regions 52 and the short regions 54. As shown in FIG. 4, the edge of the well region 18 may reflect the shape of a square wave in a "comb-like" arrangement. Each long region 52 may be separated by a width 53 of short region 54. By sequentially pairing the long regions 52 with the short regions 54, the long regions 52 may efficiently shields electric fields that would cause drain induced barrier lowering in the short region 54 during blocking state of the MOSFET device 50 and results in MOSFET breakdown voltage decrease.

In certain embodiments, a length 55 (i.e., distance from source region 20 along x-axis to edge of the well region 18) of the short region 54 may generally be limited according to an electric field that would induce channel leakage and certain limitations related to the performance of the MOSFET device 10. In one example, the length 55 of the short region 54 may be characterized as being between 0.1 µm and 1 µm. A length 57 of the long region 52 may then be characterized as being as being between 0.3 µm and 2 µm for such an example. The distance between each long region 52 along the y-axis or the width 53 of the short region 54 may generally be limited according to an electric field that would induce channel leakage. In one example, the width 53 of the short region 54 may be characterized as being between 0.1 µm and 2 µm. In another example, the width 53 of the short region 54 may be less than or equal to a difference between a length 57 of the long region 52 and a length 55 of the short region 54.

A width 58 of the long region 52 may generally be limited by the doping (p- or n-type) of the well region 18. That is, the width 58 and doping of the long region 52 provides full depletion between each long region 52. The integrated charge (i.e., depleted doping) in the long region 52 (i.e., along its width) may be higher or equal to the integrated charge in the portion of the JFET region 29 disposed between the long regions 52 (i.e., along the width of short region 54). If the integrated charge in the long region 52 is equal to the integrated charge in region between the long regions 52, the two charges may be properly balanced resulting in a super-junction or charge-balanced structure. In this case, the long portions 52, as well as the portions of the JFET regions 29 disposed between, will be completely depleted when reverse bias is applied, thereby further decreasing the electric field in both channel regions. The lower electric field in the super-junction structure may further enable the reduction of the length 57 of the long region 52. In certain embodiments, such as a periodic square wave channel region, the relationship between the width 58 of the long region 52 and the width 53 of the short region 54 may be characterized as follows:

$$W_{long}*N_{ch} \geq W_{short}*N_{epi}'$$ (1)

In Equation 1, $W_{long}$ corresponds to the width of the long region 52, $W_{short}$ corresponds to the width of the short region 54, $N_{epi}'$ corresponds to the net concentration of impurities/dopants in the epi region (i.e., area between adjacent long regions 52) bounded by elongated portion of channel region perimeter, and $N_{ch}$ corresponds to the net concentration of impurities/dopants in the channel region 28 bounded by elongated portion of channel region perimeter. The equation above assumes constant doping concentration in well regions, and constant well depth in the channel region vicinity.

In general, the relationship between the doping and dimensions of long region 52 and of the area between long regions 52 may be characterized as follows:

$$\int_V N_{ch}(x, y, z)dV \geq \int_V N_{epi}(x, y, z)dV$$

where V is the volume of semiconductor material. In certain embodiments, $N_{epi}$ portion bounded by long regions 52 may have different doping concentration compared to the remainder of the epi region.

At blocking state the total charge portions (resulting from ionized donors/acceptors) in long regions 52 may be equal or higher to the total charge in between long channel portions:

$$\int_V N_{ch}(x, y, z)dV \cong \int_V N_{epi}(x, y, z)dV$$ (2)

As such, if $\int_V N_{ch}(x, y, z)dV = \int_V N_{epi}dV$, then charge balance conditions are reached. The non-uniform/constant doping concentrations may be characterized based on Equation 1 above. For SiC, the efficient shielding of the short channel may be characterized as:

$$W\_short < L\_long - L\_short$$

Moreover, the ranges for SiC (constant doping) may be as follows: 0.1 um<W_long<2 um; 0.1 um<W_short<5 um; 1e15 cm-3<$N_{epi}$<1e17 cm-3; and 1e16 cm-3<$N_{ch}$<1e19 cm-3.

Generally, the overall length of the channel region 28 may be characterized as an effective channel length $L_{eff}$, which may be defined as follows:

$$L_{eff} = \frac{1}{T} \times \int_0^T L(x)dx$$ (3)

where L(x) is the channel length as a function of location along perimeter or edge x of the channel region 28 and T is a period of repetition. For example, for a channel region 28 with a square wave the effective channel length $L_{eff}$ is:

$$L_{eff,square} = \frac{W_{long}}{W_{short}+W_{long}} \times L_{long} + \frac{W_{short}}{W_{short}+W_{lon}} \times L_{short}$$ (4)

By employing the periodic long/short channel structure described above, the effective channel length of the presently disclosed MOSFET designs may be shorter as compared to MOSFET devices having a uniform length channel region 28, while still providing comparable blocking voltages. As a result of this shorter effective channel length, device with a channel region 28 having a non-uniform edge may conduct more current for the same applied voltage as compared to device with a channel region 28 having a uniform length. That is, the non-uniform edge channel region 28 provides a reduced on-state resistance (e.g., ~31% decrease) as compared to a uniform edge channel region.

Similarly, it may be appreciated that the reduced effective channel length enabled by the presently disclosed MOSFET designs also enable the fabrication of smaller MOSFET devices having the same current rating, thus reducing device cost.

Figure 5:
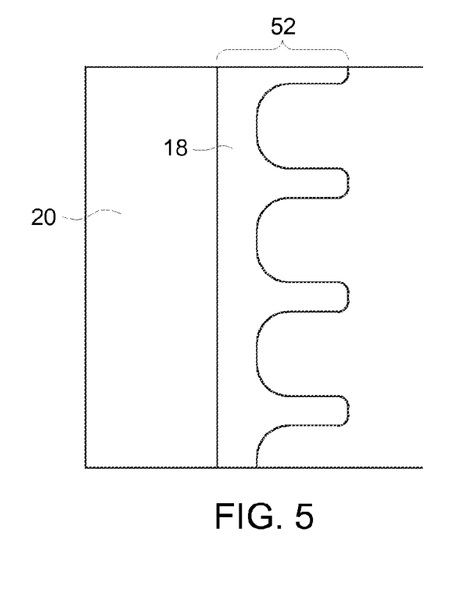
Figure 6:
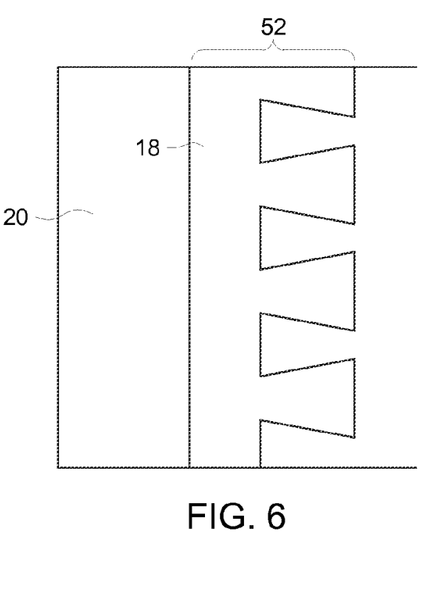
Figure 7:
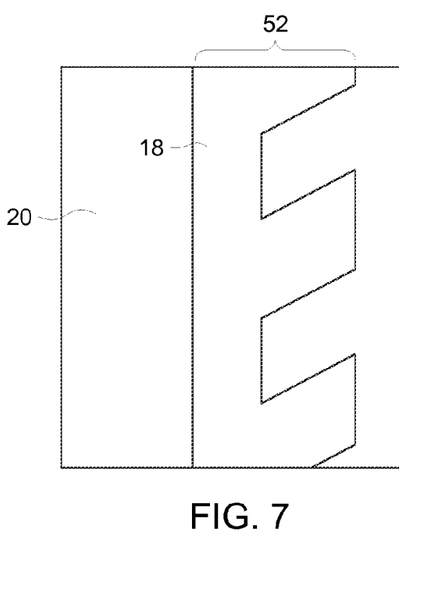

Although the foregoing description of the MOSFET device 50 in FIGS. 3 and 4 are given as having a channel region 28 with the "square-wave" or "comb-like" structure discussed above, it should be noted that the MOSFET device 50 may not be limited to using the square-wave or the comb-like structure in the channel region 28. Instead, the MOSFET device 50 may employ any suitable shape to reduce the average channel length as compared to the MOSFET device 10 having a channel region 28 with a uniform length. As such, adjacent to JFET region edge of the channel region 28 of the MOSFET device 50 may have any arbitrary shape if it still provides lower (compared to uniform channel) on-resistance $R_{ds}$(on) and efficient shielding from DIBL. For example, FIGS. 5-7 illustrate examples of various types of shapes that may be used in the channel region 28 for the MOSFET device 50. It should be noted though that the MOSFET device 50 is not limited to the shapes depicted in FIGS. 4-7. Also it should be noted that due to processing constraints (e.g., lithography resolution, lateral struggle of implanted impurities, etc.) the fabricated well pattern may differ from depicted patterns.

Figure 8:
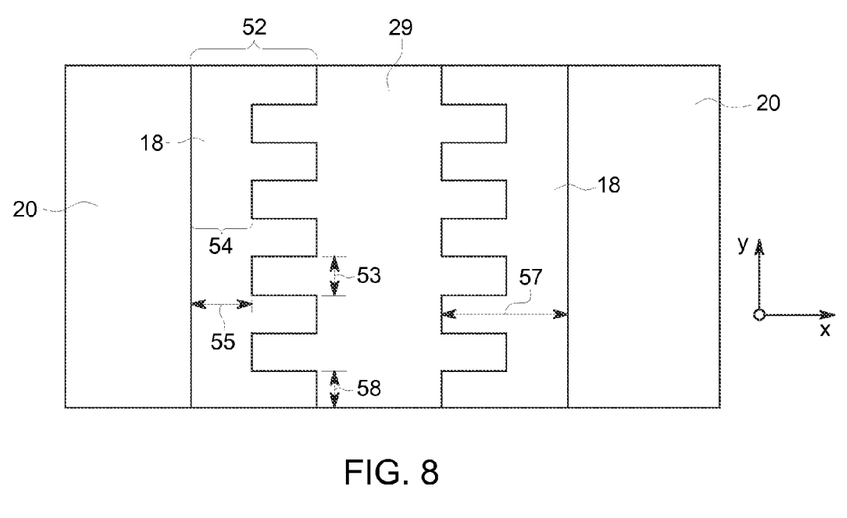
Figure 9:
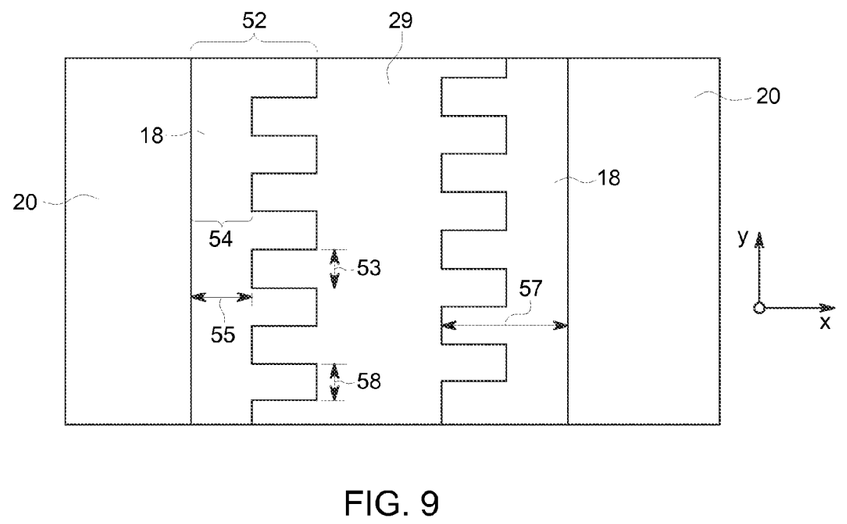
Figure 10:
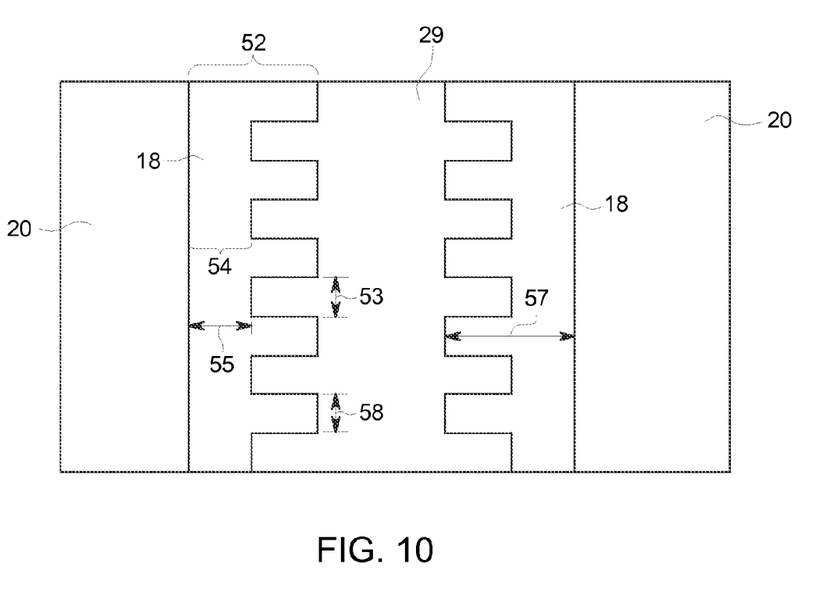
Figure 11:
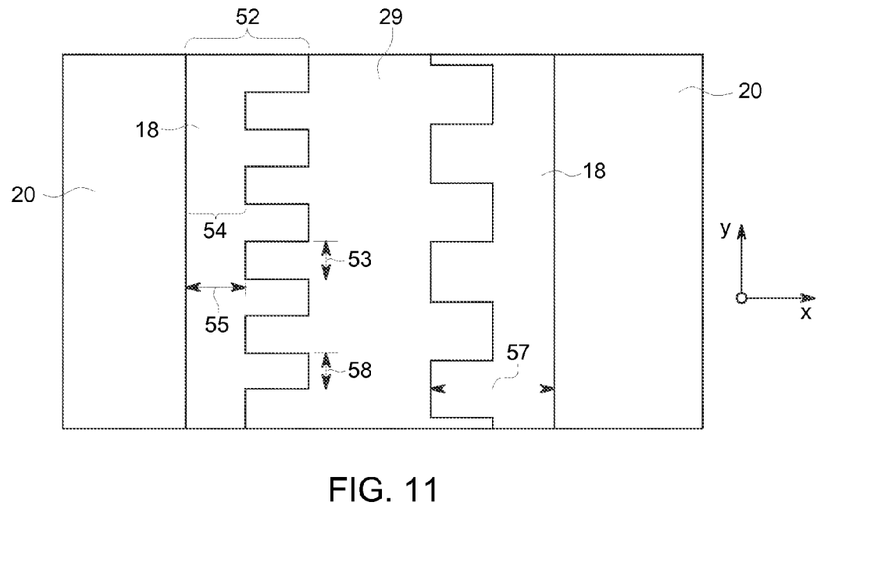

In addition to the various types of shapes that may be employed for the channel region 28 of the MOSFET device 50, it should be noted that the channel regions 20 separated by JFET region 29 of MOSFET device 50 may be aligned or misaligned in any manner. FIGS. 8-10 depict examples of how the channel region 28 may be aligned differently as compared to the channel region 28 depicted in FIG. 4. That is, for example, the pattern of the channel region 28 may be aligned such that both sides of the channel region 28 may not be aligned identically. In addition to being aligned differently, the long region 52 and the short region 54 of the channel region 28 may have different widths as illustrated in FIG. 11.

Figure 12:
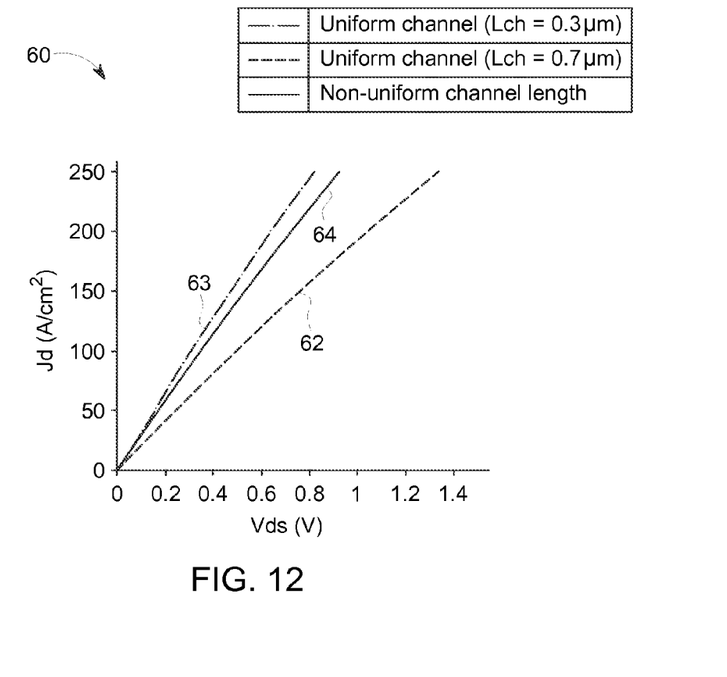
FIG. 12 illustrates a graph of an example of an on-state characteristic that corresponds to an embodiment of a MOSFET device having a channel region with non-uniform edge and a MOSFET device having a channel region of uniform length.

FIG. 12 illustrates an example of room temperature on-state characteristics (dependence of drain current normalized to device area from applied $V_{ds}$ voltage) for a 1200V class SiC MOSFET device 10 having a channel region 28 with a uniform length edge and an embodiment of the MOSFET device 50 having a channel region 28 with a non-uniform edge. As shown in FIG. 12, a graph 60 plots a relationship between the current density $J_d$ (A/cm$^2$) and the drain-to-source voltage $V_{ds}$ (V) for a MOSFET device 10 having a channel region 28 with constant channel length (uniform edges) as compared to an embodiment of a MOSFET device 50 having a channel region 28 with a non-uniform edge. Curve 62 corresponds to the MOSFET device 10 having the channel region 28 of a constant length (e.g., 0.7 μm), curve 63 corresponds to the MOSFET device 10 having the channel region 28 of a relatively smaller constant length (e.g., 0.3 μm) as compared to the channel region of curve 62, and curve 64 corresponds to the MOSFET device 50 having the channel region 28 with non-uniform edge. As will be appreciated, the curve 64 exhibits a relatively higher current density for the respective drain-to-source voltage as compared to the curve 62 and a current density that is close to the current density represented by the curve 63.

Figure 13:
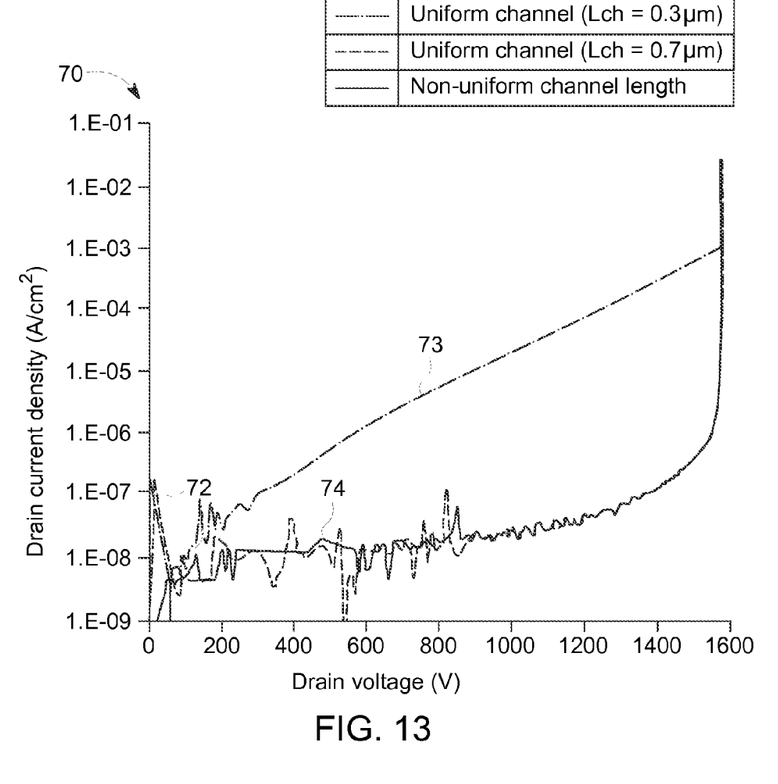
FIG. 13 illustrates a graph indicating blocking characteristics for an embodiment of a MOSFET device having a channel region with non-uniform edge and a MOSFET device having a channel region with uniform edge.

Although the MOSFET device 50 having the channel region 28 with non-uniform edge may conduct current more efficiently than the MOSFET device 10 having the channel region 28 of uniform length, it should be noted that the blocking voltage generally remains the same for both types of MOSFETs. With this in mind, FIG. 13 illustrates a graph 70 that depicts an example of the blocking voltage for the 1200V class SiC MOSFET device 10 having the channel region 28 of uniform length as compared to an embodiment of the MOSFET device 50 having the channel region 28 with non-uniform edge. Curve 72 corresponds to the drain current density $J_d$ (A/cm$^2$) versus drain voltage $V_{ds}$ of the MOSFET device 10 having the channel region 28 of uniform length (e.g., 0.7 μm). Curve 73 corresponds to the drain current density $J_d$ (A/cm$^2$) versus drain voltage $V_{ds}$ of the MOSFET device 10 having the channel region 28 of uniform length (e.g., 0.3 μm) that is shorter than the channel region 28 that corresponds to the curve 72. In the same manner, curve 74 corresponds to the drain current versus drain voltage for the MOSFET device 50 having the channel region 28 with non-uniform edge. As shown in FIG. 13, curve 72 and curve 74 indicate that the blocking voltage for both types of MOSFET devices are approximately the same, despite the shorter average channel length of the MOSFET device 50 having the non-uniform edge channel region 28. However, the curve 74 maintains a drain current density that is substantially lower than the curve 73 for short channel regions.

Figure 14A:
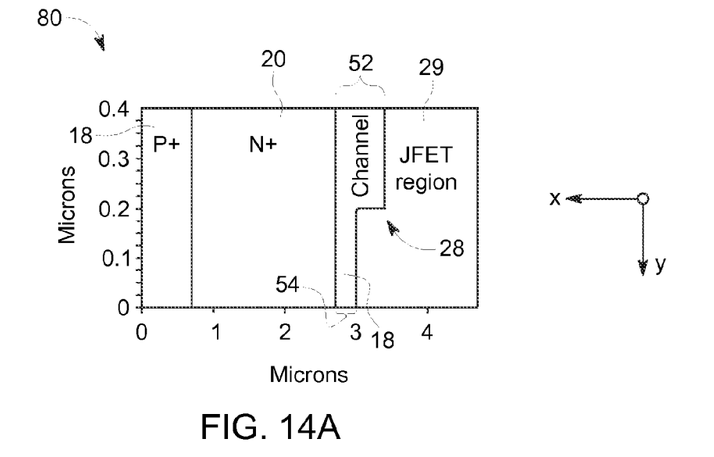
FIGS. 14A and 14B illustrate a top view of the portion of MOSFET device active area of FIG. 3 and an electric field distribution for the MOSFET device of FIG. 3 at blocking state $V_{ds}$=1200V, respectively, in accordance with an embodiment.

The capability of the MOSFET device 50 having the channel region 28 with non-uniform edge to provide lower on-state resistance and maintain the same blocking voltage of the MOSFET device 10 having the channel region 28 of uniform length may be attributed to the proper shielding of the short regions 54 by the long regions 52. This shielding allows the electric field in the JFET region 29 between the short channel regions 54 to be the same as in the JFET region 29 between the long channel regions 52. With this in mind, FIG. 14A illustrates a top view of an embodiment of part of a cell of a MOSFET device 80 illustrated in FIG. 3 having a channel region 28 with non-uniform edge, and FIG. 14B illustrates a view of an electric field distribution in the upper portion of epitaxial layer 2 of the MOSFET device 80 having a channel region 28 with non-uniform edge at $V_{ds}$=1200V.

Figure 14B:
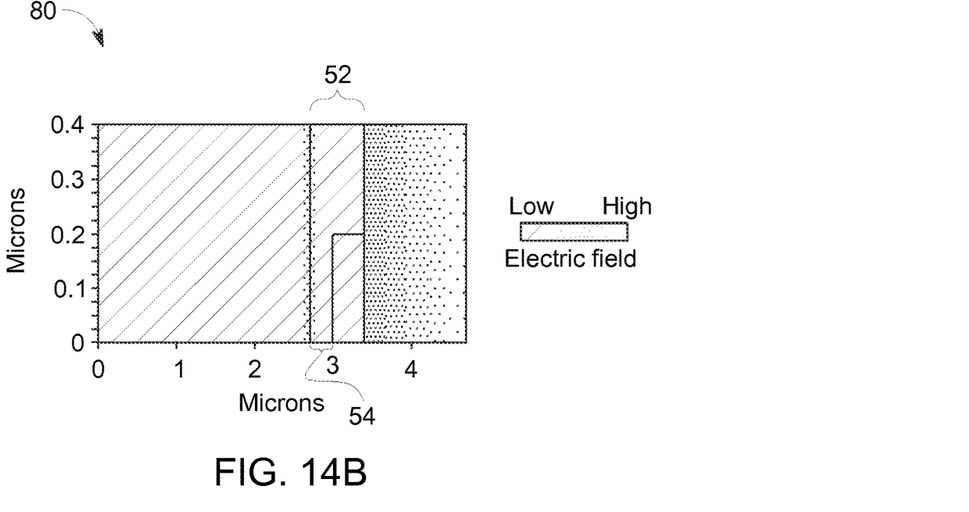

As shown in FIG. 14B, the electric field in the center of JFET region 29 at the drain voltage 1200V is generally the same. Thus no reliability deterioration is expected in MOSFET with non-uniform channel design. This shielding prevents channel leakage increase, which would be present in the MOSFET device 10 having a channel region 28 of uniform length and a similar average channel length under similar bias, due to, for example, drain-induced barrier lowering (DIBL). That is, the short region 54 does not experience any deficiencies in its associated electric field distribution due to a shielding effect provided by the long region 52. As mentioned above, the sequencing of long regions 52 and short regions 54 as shown in FIG. 3 effectively creates a channel region 28 with a smaller average/effective length and reduced conduction losses as compared to the MOSFET device 10 having the channel region 28 of uniform length, while maintaining the same blocking capability.

Figure 15:
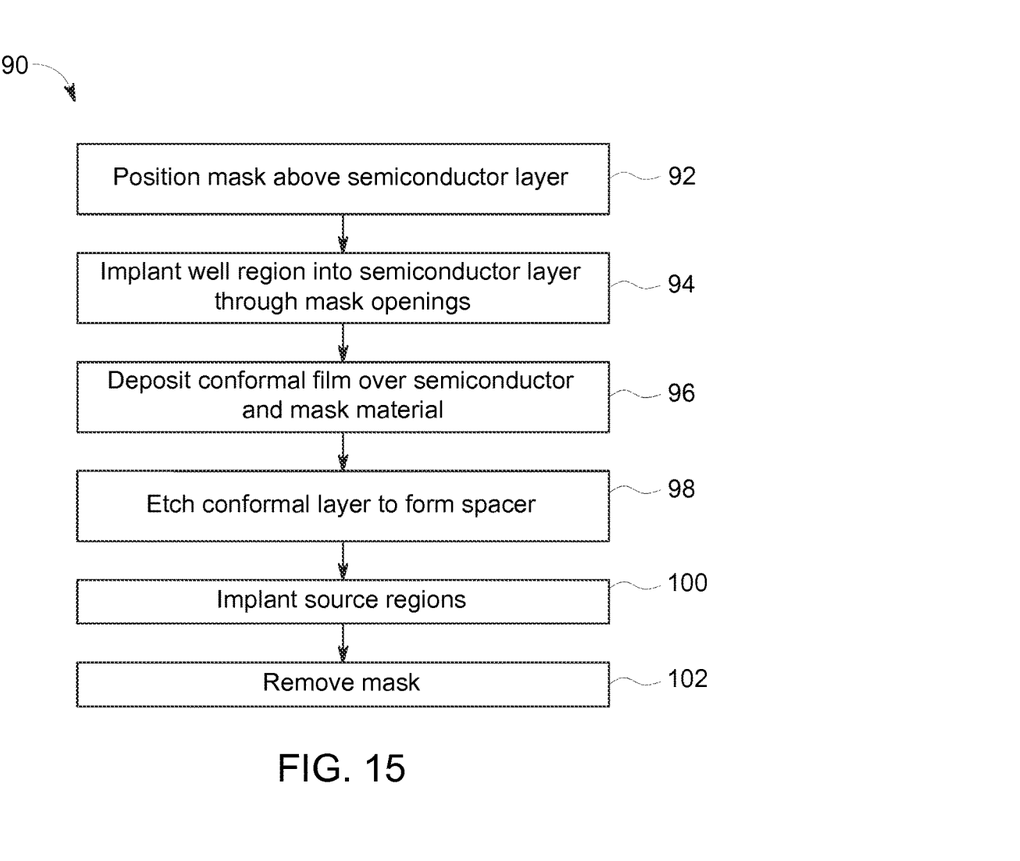
FIG. 15 illustrates an example of simplified flow chart of a method for manufacturing a non-uniform edge channel region for the MOSFET device of FIG. 3, in accordance with an embodiment.

Different fabrication techniques may be employed to fabricate the MOSFET device 50 having the channel region 28 with non-uniform edge. The techniques may involve fine-scale lithography, self-aligned channel fabrication schemes, and the like. By way of example, FIG. 15 illustrates a flow chart of an embodiment of a method 90 for fabricating the MOSFET device 50 having a channel region with non-uniform edge, as described above. FIGS. 16-20B depict images related to the blocks of the method 90 of FIG. 15.

Figure 16A:
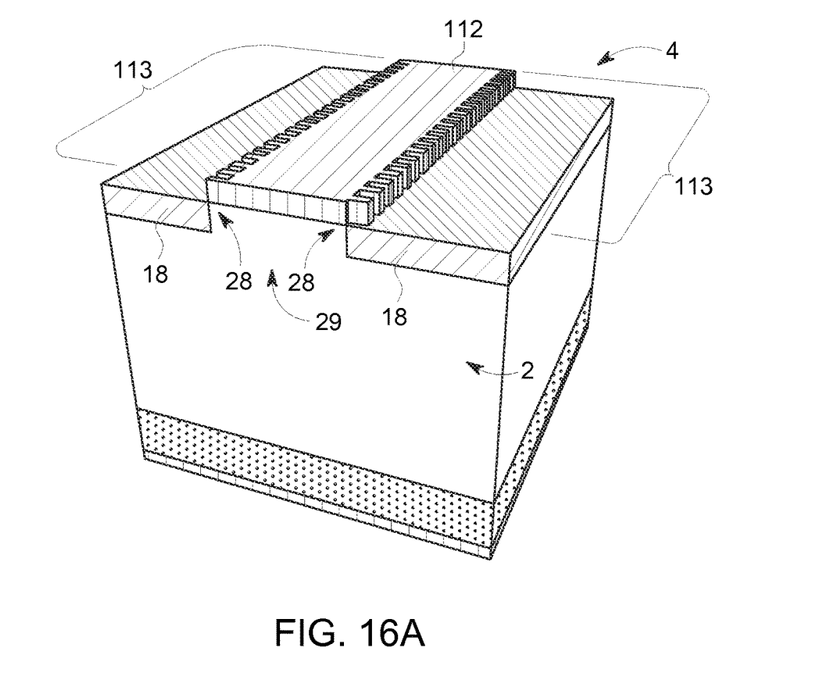
FIGS. 16A, 16B, 17A, 17B, 18, 19, 20A, and 20B illustrate perspective and top views of a MOSFET device during the non-uniform edge channel manufacturing process of FIG. 8, in accordance with an embodiment.
Figure 16B:
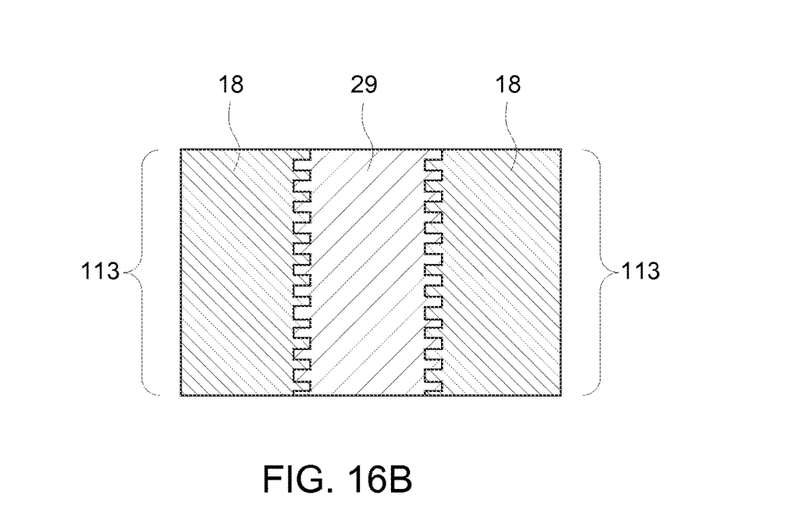

Referring now to FIG. 15, at block 92, a mask 112 may be positioned above the epitaxial semiconductor layer 2 before implanting the well regions 18. In one embodiment, as illustrated in FIG. 16A, the mask 112 may include a repetitive pattern of sequential protrusions along two edges 113 of the mask 112. An example of square-wave pattern is further illustrated in FIG. 16B depicting a top view of the mask 112. The square-wave pattern may reflect dimensions of the long region 52 and the short region 54 discussed above.

At block 94, after positioning the mask 112, the doping, resulting in opposite to epitaxial layer type of conductivity, the well regions 18 are implanted into the semiconductor layer 2. As such, referring to FIG. 16A, the well regions 18 may be formed in the semiconductor layer 2 of the MOSFET device 50, and the mask 112 may impart the shape of perimeter of these well regions 18. That is, the mask 112 blocks implantation in certain portions of the epitaxial semiconductor layer 2 and allows implantation in other portions of the epitaxial semiconductor layer 2, forming the shorter portions 54 of the channel region 28, and the longer portions 52 of the channel region 28 according to mask pattern.

Figure 17A:
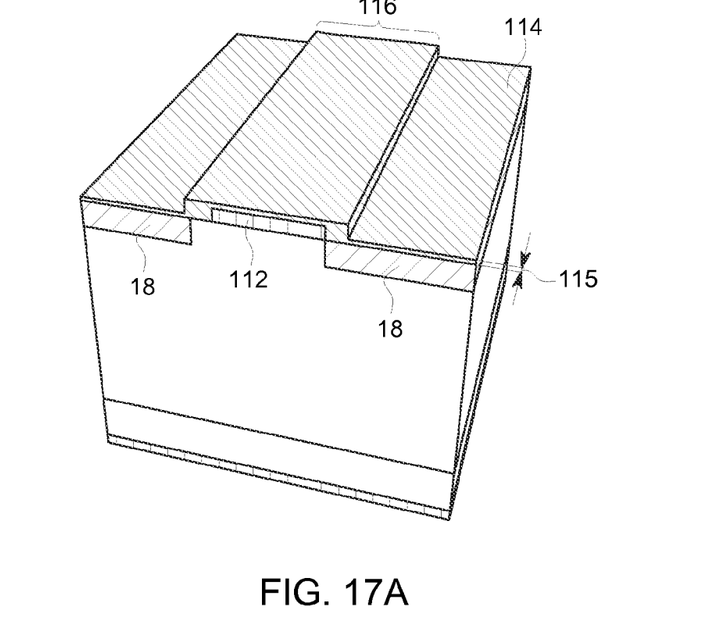
Figure 17B:
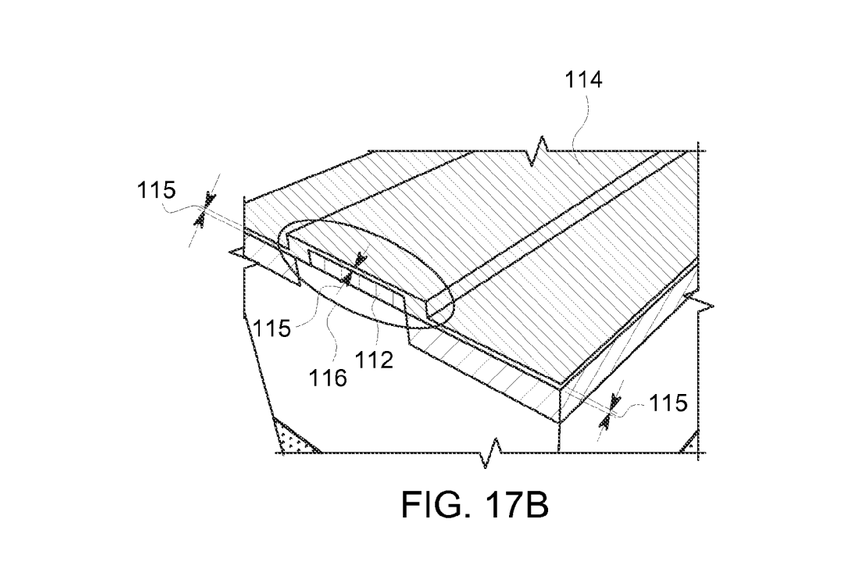

At block 96, a conformal film layer 114 may be formed above the top of semiconductor epilayer and the mask 112. In one embodiment, this layer 114 may be a film, dielectric film, or any deposited conformal film deposited using techniques (e.g., an oxide deposition technique, a silicon dioxide deposition technique, a silicon nitride deposition technique, a polysilicon deposition technique, or a photoresist deposition technique) that provide a substantially conformal layer. Referring to FIG. 17A, the film 114 may fill the spaces or gaps between protrusions of the mask 112. In other words, the layer 114 may generally have a thickness 115 that defines spacer width, and thus distance of the second mask edge from the outer edges 113 of the mask 112, which is used to form self-aligned source regions 20 and self-aligned region channel region, as discussed below. FIG. 17B illustrates a perspective view that depicts the thickness 115 of the layer 114 over the entire surface of the mask 112 and the well regions 18. Regarding the conformal film layer 114, it should be noted that when the conformal film layer 114 is formed within the spaces or gaps between the protrusions of the mask 112, the conformal film layer 114 may form small amplitude protrusions that extend beyond the length of the conformal film layer 114 where the protrusions of the mask 112 are located. As a result, the protrusions of the mask 112 may make the inner edge of the channel also non-uniform.

Figure 18:
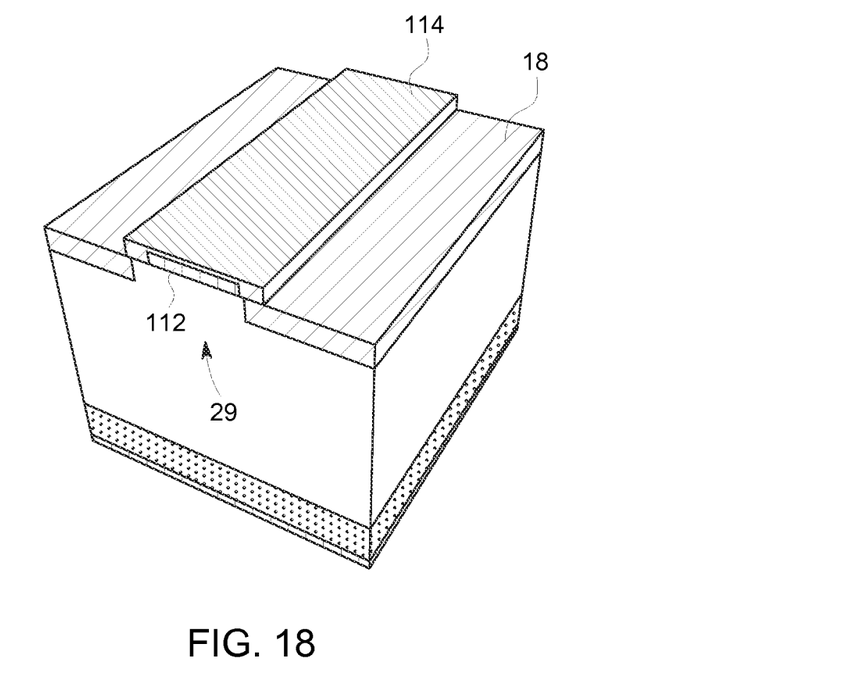
Figure 19:
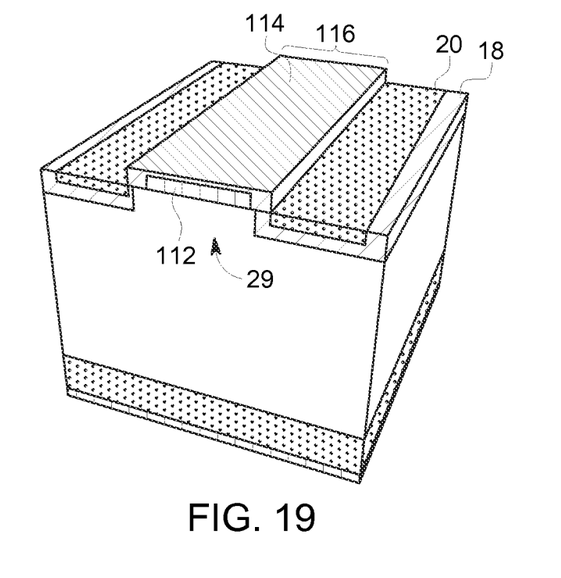

At block 98, the conformal film layer 114 may be etched to partially expose the well regions 18, as shown in FIG. 18. It may be appreciated that, using proper etching conditions, the differences in the etching rates of the various faces of the layer 114 ensures that the well regions 18 are partially exposed while some portion of the layer 114 on sidewalls of the mask 112 remains intact. This remainder of layer 114 forms a spacer defining long and short channel regions. At block 100, the source regions 20 may be implanted using a formed mask, as shown in FIG. 19. In this self-aligned process, the portion of the layer 114 that remains on the sidewall of the mask 112 (e.g., after the etch as shown in block 98) defines the position of the implanted source regions 20 with respect to well region 18 (block 100).

Figure 20A:
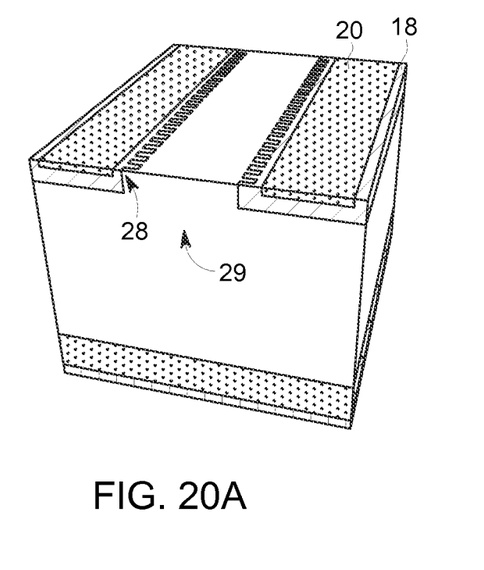
Figure 20B:
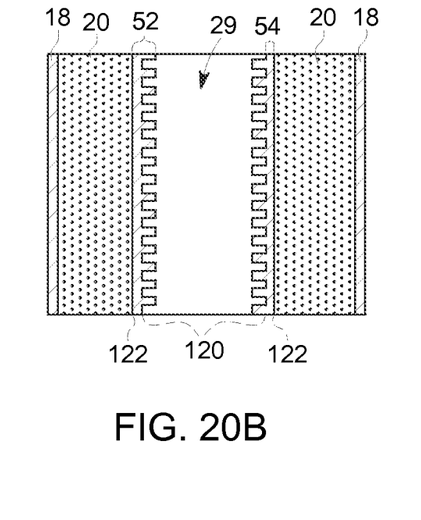

At block 102, the mask 112 and the spacer may be removed, as shown in FIGS. 20A (perspective view) and 13B (top view). Subsequently, typical semiconductor techniques (e.g., top metallization, passivation, edge termination, and so forth) may be used to fabricate the remainder of the structure of the MOSFET device 50 having the channel region 28 with non-uniform edge. It may be noted that the process 90 illustrated in FIG. 15 utilizes standard process steps that would be used for conventional planar MOSFET fabrication and does not add any additional complexity (to the fabrication process for the MOSFET device 50 when compared to a process for fabricating the MOSFET device 10 having a channel region 28 of uniform length; however, the reduced channel resistance and the high blocking voltages provided by the MOSFET device 50 having the channel region 28 with non-uniform edge provides clear performance advantages.

Technical effects of the embodiments described herein include improving the current conduction capability of the channel region 28 of the MOSFET device 50 by reducing an effective resistance of the channel region 28. By using a channel region 28 with non-uniform edge, the effective length of the channel region 28 may be reduced. This smaller average channel region length provides a reduced channel resistance as compared to the MOSFET device 10 having channel regions of uniform length, while still maintaining a high blocking voltage. As a result, the conductions losses associated with the MOSFET device 50 having the non-uniform edge channel regions 28 are lower, yielding a more efficient MOSFET device for power-related applications.

This written description uses examples to disclose the structures and methods described herein, including the best mode, and also to enable any person skilled in the art to practice the structures and methods described herein, including making and using any devices or systems and performing any incorporated methods. The patentable scope of the structures and methods described herein are defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A semiconductor device structure, comprising:
a drift region having a first conductivity type;
a source region having the first conductivity type;
a well region having a second conductivity type disposed adjacent to the drift region and adjacent to the source region, wherein the well region comprises:
a channel region having the second conductivity type disposed adjacent to the source region and proximal to a surface of the semiconductor device structure, wherein the channel region comprises a non-uniform edge, wherein the non-uniform edge comprises at least two protrusions forming a periodic non-uniform pattern along a periphery of the well region with a reduced effective channel length,
wherein the non-uniform edge region comprises a plurality of first sections and a plurality of second sections, wherein each of the plurality of first sections is longer than each of the plurality of second sections,
wherein the reduced effective channel length is designed by independently selecting at least one of: at least one of a plurality of possible shapes for the periodic non-uniform pattern; a first alignment of the plurality of the first sections relative to a second alignment of the plurality of the second sections; and a first width of at least some of the plurality of the first sections relative to a second width of at least some the plurality of the second sections, further wherein the reduced effective length of the plurality of second sections is between approximately 0.1 µm and approximately 1 µm.

2. The semiconductor device structure of claim 1, wherein the reduced effective length of the plurality of first sections is between approximately 0.3 µm and approximately 2 µm.

3. The semiconductor device structure of claim 1, wherein a distance between each of the plurality of first sections is between approximately 0.1 µm and approximately 1 µm.

4. The semiconductor device structure of claim 1, wherein a distance between each of the plurality of first sections is approximately less than or equal to a difference between a first length of each of the plurality of first sections and a second length of each of the plurality of second sections.

5. The semiconductor device structure of claim 1, wherein the reduced effective channel length is characterized in terms of: channel length as a function of location along the edge of the channel region and a period of repetition of the pattern.

6. A semiconductor device structure, comprising:
a substrate layer;
an epitaxial layer disposed on top of the substrate layer, wherein the epitaxial layer comprises:
    a source region implanted into a surface of the epitaxial layer and having a first conductivity type; and
    a well region implanted into the surface of the epitaxial layer adjacent the source region and having a second conductivity type,
    wherein the well region comprises a non-uniform edge that defines a channel region with the non-uniform edge,
    wherein the non-uniform edge comprises plurality of first sections and a plurality of second sections, wherein each of the plurality of first sections is longer than each of the plurality of second sections,
    wherein the non-uniform edge comprises at least two protrusions forming a periodic non-uniform pattern along a periphery of the well region with a reduced effective channel length,
    wherein the effective channel length is designed by independently selecting at least one of: at least one of a plurality of possible shapes for the periodic non-uniform pattern; a first alignment of the plurality of the first sections relative to a second alignment of the plurality of the second sections; and a first width of at least some the plurality of the first sections relative to a second width of at least some the plurality of the second sections,
    further wherein the reduced effective length of the plurality of second sections is between approximately 0.1 µm and approximately 1 µm.

7. The semiconductor device structure of claim 6, comprising:
an insulator disposed on the epitaxial layer, the well region, and the source region; and
a gate electrode disposed on the insulator.

8. The semiconductor device structure of claim 6, wherein the plurality of first sections and the plurality of second sections are configured to prevent leakage current density below 1 mA/cm2 at a maximum rated blocking voltage due to drain-induced barrier lowering (DIBL).

9. The semiconductor device structure of claim 6, wherein the plurality of first regions is configured to maintain approximately the same electric field along a junction field-effect transistor (JFET) region in the epitaxial layer between any opposing section of the plurality of first and second sections during blocking operation of the semiconductor device structure.

10. The semiconductor device structure of claim 6, wherein a first total charge of the plurality of first sections is greater than or equal to a second total charge bounded by plurality of first sections when the semiconductor device structure is in a blocking state.

11. The semiconductor device structure of claim 6, wherein the doping concentration of the channel region with respect to the epitaxial layer corresponds to:

$$W\_long * N_{ch} \geq W\_short * N_{epi}$$

where W_long corresponds to a width of one of the plurality of first sections, W_short corresponds to a width of one of the plurality of second sections, $N_{ch}$ corresponds to a doping concentration of the channel region, and $N_{epi}$ corresponds to a doping concentration of the epitaxial layer.

12. The semiconductor device structure of claim 11, wherein the width of the one of the plurality of first sections is approximately between 0.1 µm and 2 µm, wherein the length of the one of the plurality of first sections is approximately between 0.1 µm and 2 µm.

13. The semiconductor device structure of claim 11, wherein $N_{epi}$ is within a first range between 1e15 cm-3 and 1e17 cm-3, and wherein $N_{ch}$ is within a second range between 1e16 cm-3 and 1e19 cm-3.

14. The semiconductor device structure of claim 6, wherein a width of one of the plurality of second sections is less than or equal to a difference between a length of one of the plurality of first sections and a length of the one of the plurality of second sections.

15. The semiconductor device structure of claim 6, wherein the reduced effective channel length is characterized in terms of: channel length as a function of location along the edge of the channel region and a period of repetition of the pattern.

* * * * *